(12) United States Patent
Oga

(10) Patent No.: US 10,447,237 B2
(45) Date of Patent: Oct. 15, 2019

(54) PIEZOELECTRIC BLANK, PIEZOELECTRIC VIBRATION ELEMENT AND PIEZOELECTRIC VIBRATION DEVICE

(71) Applicant: KYOCERA Crystal Device Corporation, Higashine-shi, Yamagata (JP)

(72) Inventor: Takahiro Oga, Higashine (JP)

(73) Assignee: KYOCERA CORPORATION, Kyoto-shi, Kyoto (JP)

(*) Notice: Subject to any disclaimer, the term of this patent is extended or adjusted under 35 U.S.C. 154(b) by 482 days.

(21) Appl. No.: 15/353,977

(22) Filed: Nov. 17, 2016

(65) Prior Publication Data

US 2017/0317661 A1    Nov. 2, 2017

(30) Foreign Application Priority Data

Apr. 28, 2016  (JP) .................................. 2016-090877
Jul. 19, 2016  (JP) .................................. 2016-141531

(51) Int. Cl.
  *H03H 9/21*     (2006.01)
  *H01L 41/053*   (2006.01)
  *H03H 9/10*     (2006.01)

(52) U.S. Cl.
  CPC ............. *H03H 9/21* (2013.01); *H01L 41/053* (2013.01); *H03H 9/10* (2013.01)

(58) Field of Classification Search
  CPC ........... H03H 9/21; H03H 9/10; H01L 41/053
  USPC .................................................. 310/367, 370
  See application file for complete search history.

(56) References Cited

U.S. PATENT DOCUMENTS

| | | | | |
|---|---|---|---|---|
| 6,806,797 B2* | 10/2004 | Kikushima | ........ | G01C 19/5607 29/25.35 |
| 7,193,354 B2* | 3/2007 | Kawashima | ............. | H03B 5/36 310/366 |
| 9,654,082 B2* | 5/2017 | Yamada | ................... | G01L 1/106 |
| 2003/0071542 A1 | 4/2003 | Satoh et al. | | |
| 2011/0227458 A1* | 9/2011 | Tanaya | ................. | H03H 9/1021 310/344 |
| 2016/0182012 A1* | 6/2016 | Lim | ........................ | H03H 9/21 310/370 |

FOREIGN PATENT DOCUMENTS

| | | | | |
|---|---|---|---|---|
| CH | 705945 A2 * | 6/2013 | ............... | H03H 3/02 |
| JP | 2004-88706 A | 3/2004 | | |

* cited by examiner

*Primary Examiner* — Thomas M Dougherty
(74) *Attorney, Agent, or Firm* — Westerman, Hattori, Daniels & Adrian, LLP

(57) ABSTRACT

A crystal blank includes a vibrating arm which extends in a direction intersecting the polarization direction. In at least one of the upper surface and lower surface which are parallel to the direction of extension of the vibrating arm and run along polarization direction, the vibrating arm is provided with two recesses (grooves) in the width direction of the surface thereby having a pair of outer walls which are positioned on the two sides of the two recesses and a middle wall which is positioned between the two recesses. In the middle wall, the apex part is located at a position lower than the apex part of each of the pair of outer walls and is thinner than each of the pair of outer walls at the same heights.

4 Claims, 7 Drawing Sheets

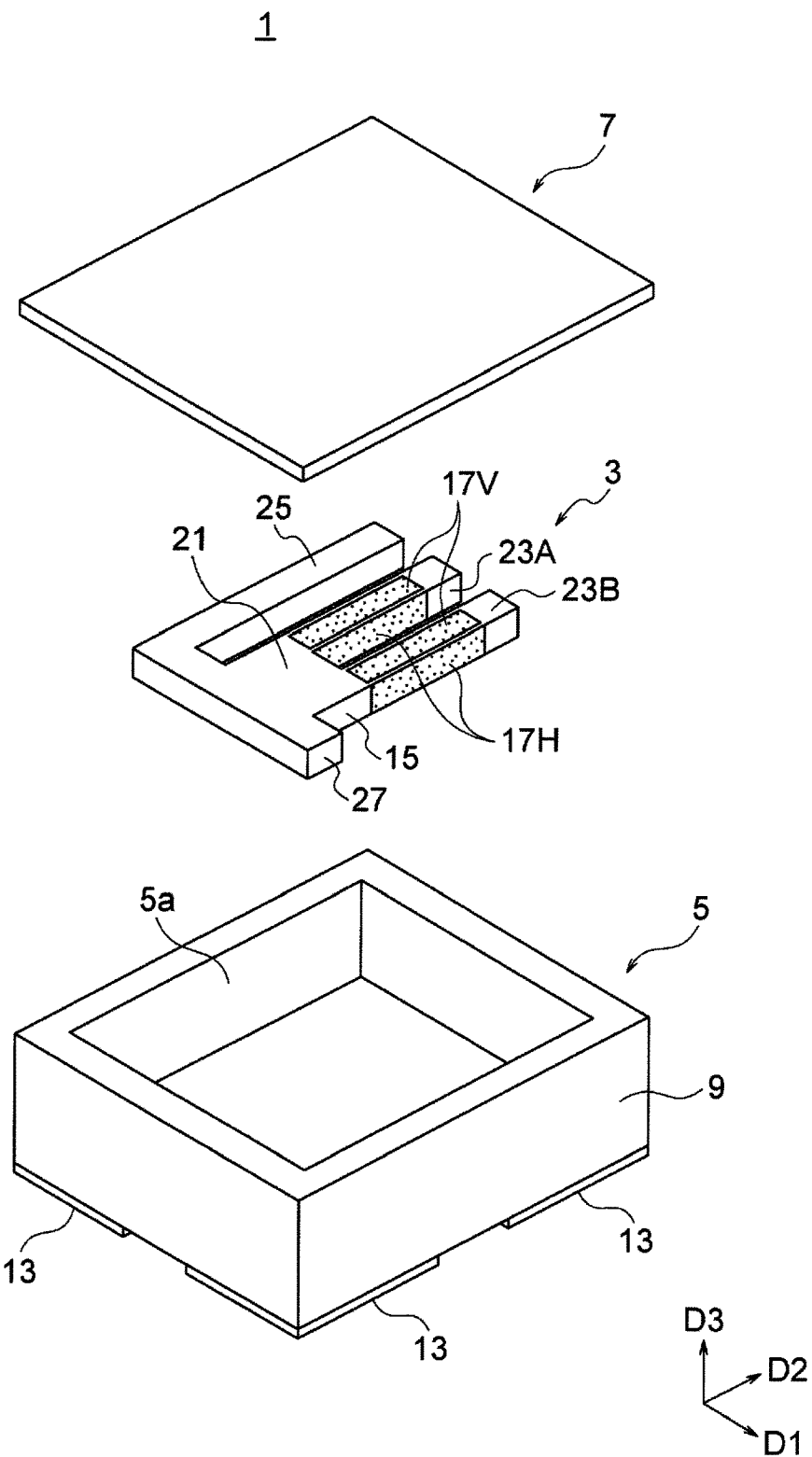

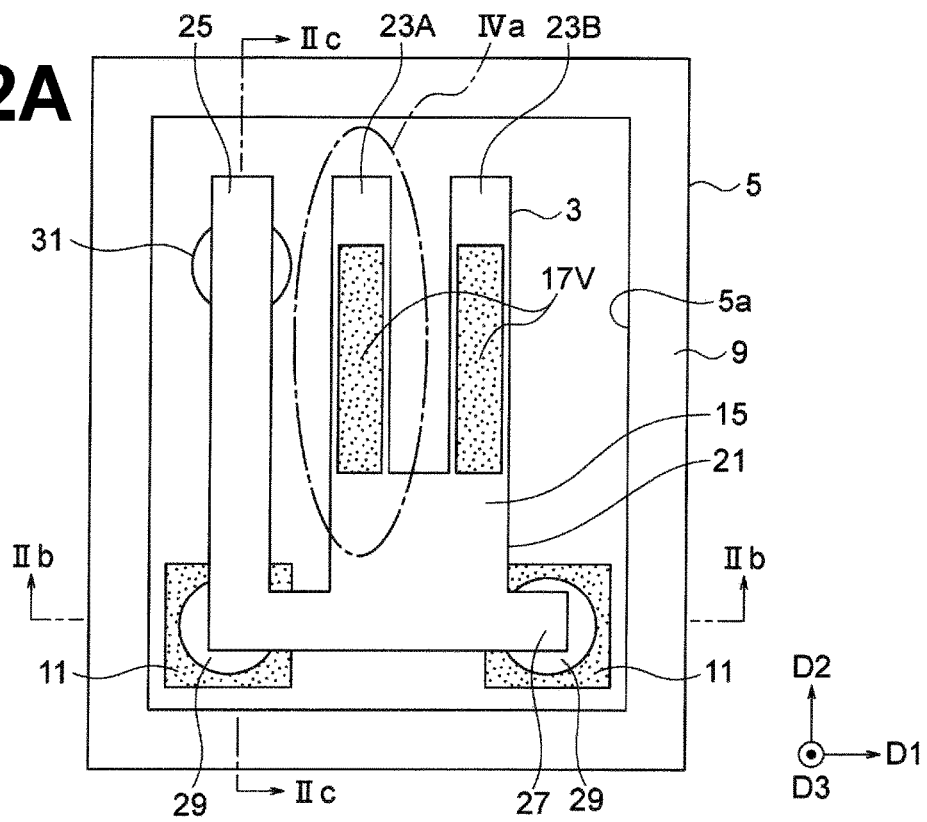
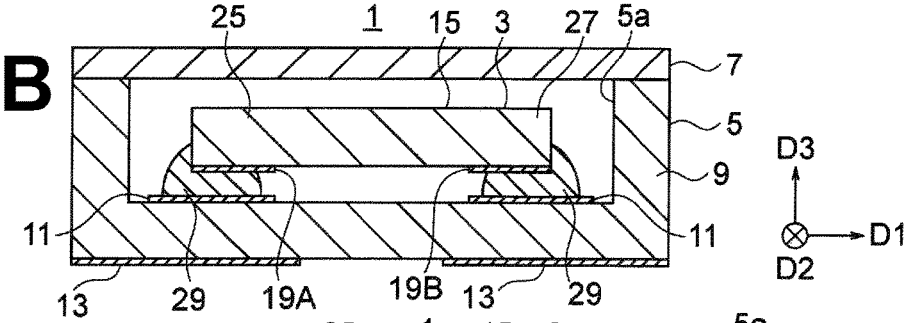
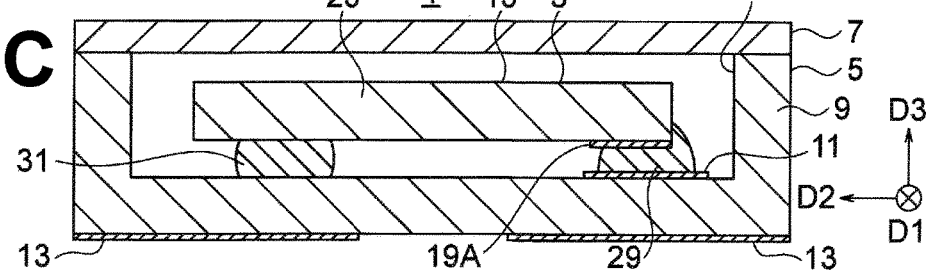
FIG. 2A
FIG. 2B
FIG. 2C

FIG.4A
FIG.4B
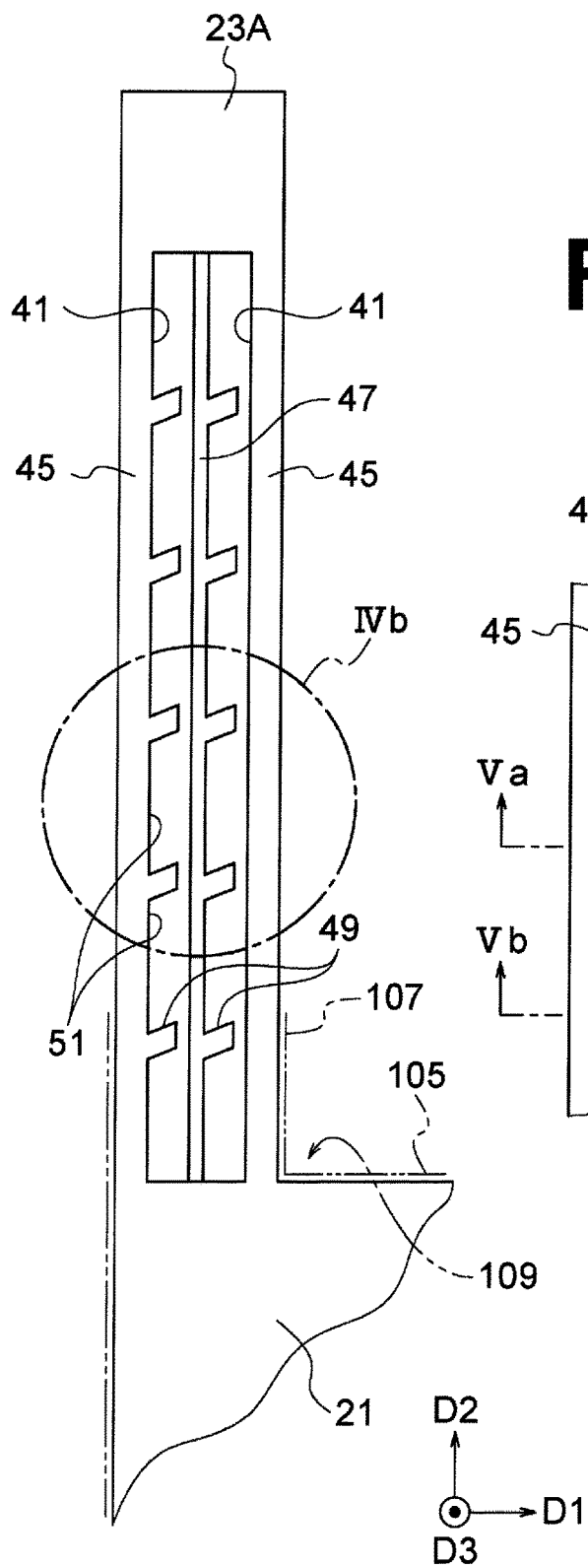
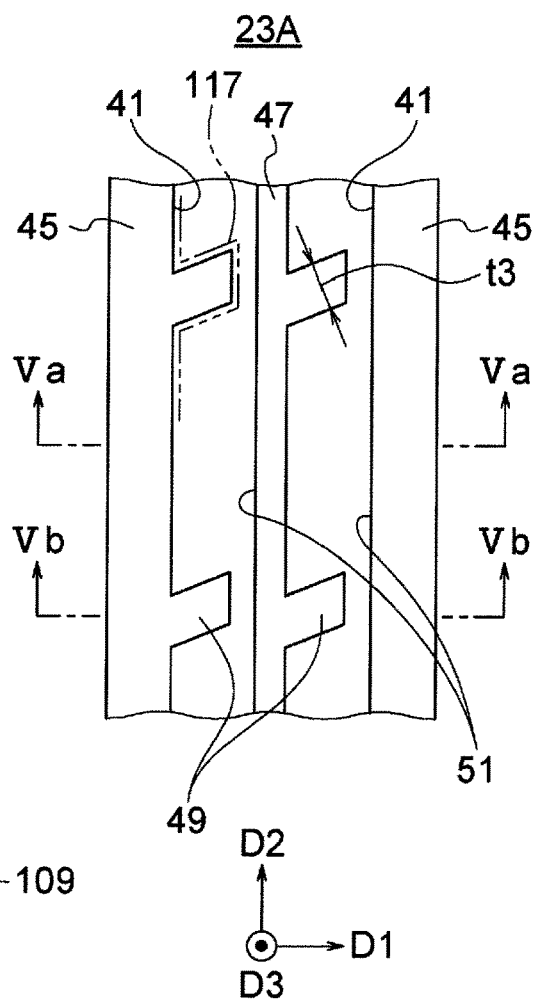

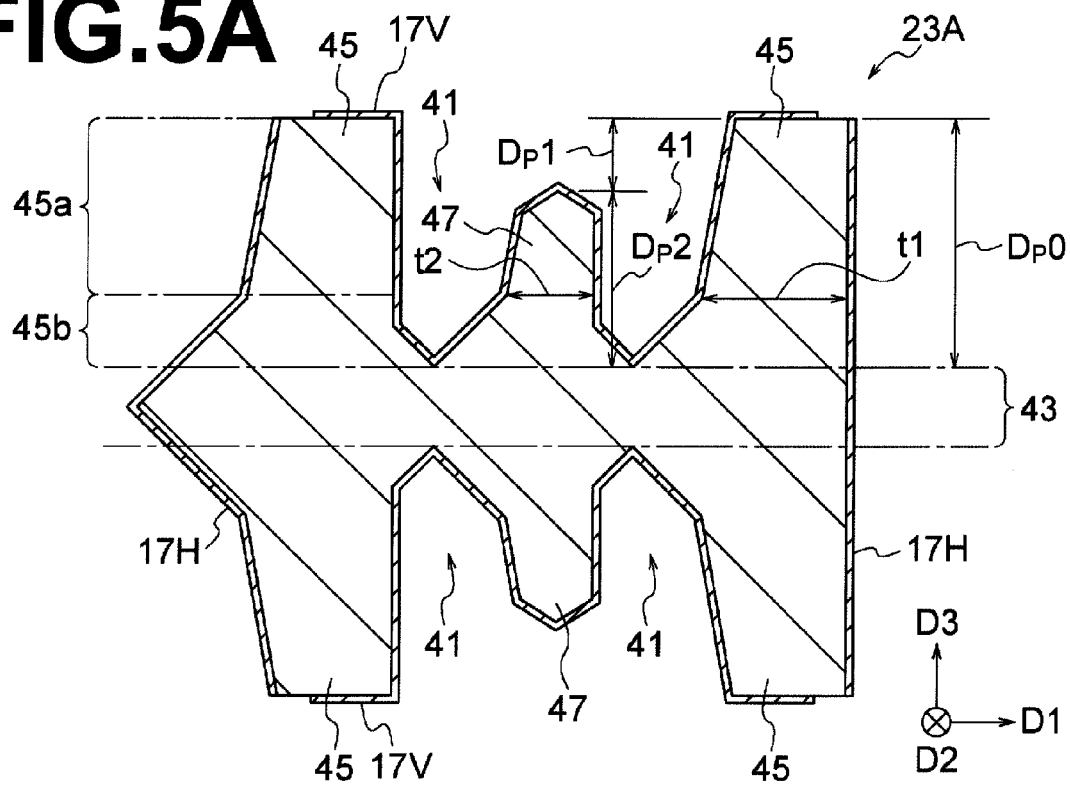
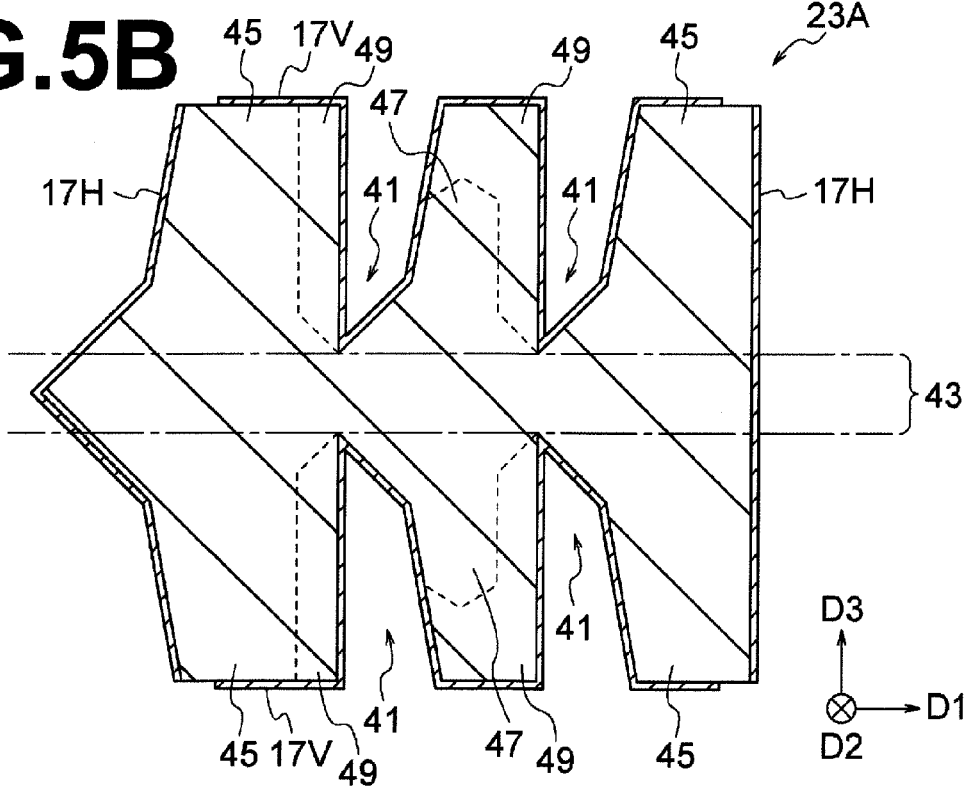

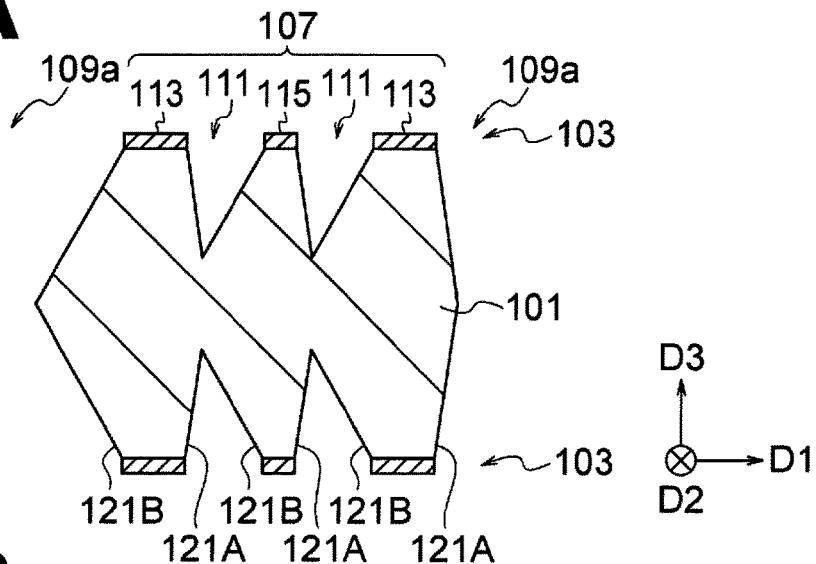
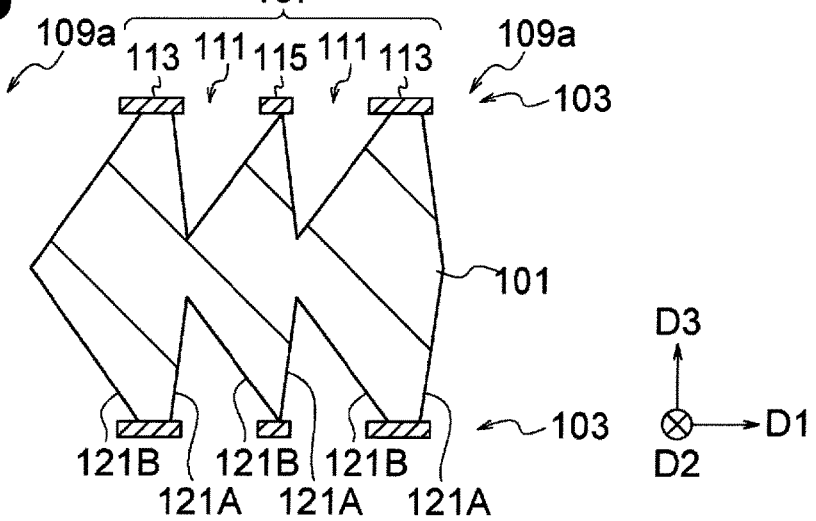
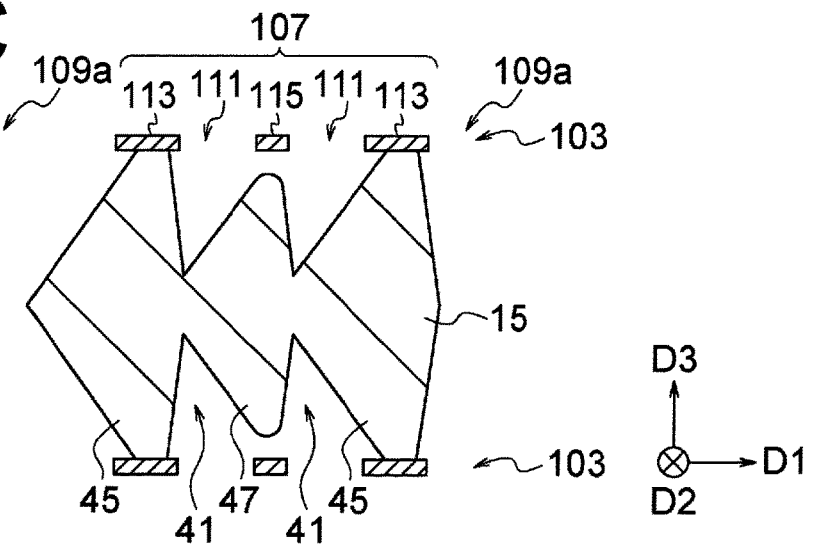

PIEZOELECTRIC BLANK, PIEZOELECTRIC VIBRATION ELEMENT AND PIEZOELECTRIC VIBRATION DEVICE

TECHNICAL FIELD

The present invention relates to a piezoelectric blank, piezoelectric vibration element, and piezoelectric vibration device.

BACKGROUND ART

As the piezoelectric vibration device (for example crystal unit or oscillator) utilized for generation of an oscillation signal and so on, for example a tuning fork type is known (for example Patent Literature 1). A tuning fork type piezoelectric vibration device is provided with a piezoelectric blank (for example crystal blank) having a base part and a pair of arms extending parallel from the base part which utilizes vibration caused in the pair of arms by application of voltage to the pair of arms so as to generate an oscillation signal.

Patent Literature 1 discloses a piezoelectric blank in which a single groove extending along the arms is formed on an upper surface and lower surface of the arm (planes which are parallel to the direction of extension of the pair of arms and to the direction of lineup of the pair of arms). Further, Patent Literature 1, as a method of forming this one groove by etching, proposes a method of first forming two thin grooves by etching then etching away the ridge part between the two thin grooves to form a single wide groove.

Patent Literature 1 also discloses a method of not completely removing the ridge part but leaving a little. Patent Literature 1 claims that, by leaving the ridge part in the single wide groove, it is possible to increase the surface area in the single wide groove and consequently increase the area of the excitation electrode and therefore it is possible to lower the crystal impedance (CI). Further, Patent Literature 1 states to it is possible to make the deepest part of the single wide groove deeper to lower the CI while securing the rigidity of the arms by the ridge part.

CITATION LIST

Patent Literature

Patent Literature 1. Japanese Patent Publication No. 2004-88706A

SUMMARY OF INVENTION

Technical Problem

Reduction of the CI is always demanded. Further, a proposal of various methods for lowering CI is preferred from the viewpoint of improving the degree of freedom of design and/or degree of freedom of selection of the production method. Accordingly, it is desired to provide a piezoelectric blank, piezoelectric vibration element, and piezoelectric vibration device and a method for producing the piezoelectric blank capable of lowering the CI by a new configuration or procedure.

Solution to Problem

A piezoelectric blank according to one aspect of the present invention includes an arm part which extends in a direction intersecting the polarization direction. The arm part includes a predetermined surface which is parallel to the direction of extension of the arm part and runs along the polarization direction and is provided with two or more recesses in the width direction of the predetermined surface, thereby comprising a pair of outer walls which are positioned on the two sides of the two or more recesses and one or more middle walls positioned between the two or more recesses. The middle wall includes an apex part located at a position lower than the apex part of each of the pair of outer walls and is thinner than each of the pair of outer walls at the same height.

Preferably, the pair of outer walls include apex parts located at heights equal to each other and have equal thicknesses at the same heights.

Preferably, the arm part is provided with two or more sets of recesses each including two or more recesses, in its extension direction, thereby including one or more transverse walls positioned among the two or more sets of recesses. The apex part of transverse wall is located at a position higher than the apex part of the middle wall.

A piezoelectric vibration element according to one aspect of the present invention includes the above piezoelectric blank, a first electrode which is arranged over the two or more recesses on the predetermined surface, and a pair of second electrodes which are arranged on a pair of side surfaces of the arm part which are positioned on the two sides of the width direction relative to the predetermined surface and intersect with the predetermined surface.

A piezoelectric vibration device according to one aspect of the present invention includes the above piezoelectric vibration element and a mounting base on which the piezoelectric vibration element is mounted.

A method for producing a piezoelectric blank according to one aspect of the present invention includes a mask forming step of forming a mask on a major surface running along a polarization direction of a piezoelectric wafer and an etching step of etching the piezoelectric wafer through the mask. The mask includes a arm correspondence part. The arm correspondence part is provided with two or more openings in the width direction of the arm correspondence part, thereby including a pair of outer wall correspondence parts positioned on the two sides of the two or more openings and one or more middle wall correspondence parts positioned between the two or more openings. The middle wall correspondence part is thinner than each of the pair of outer wall correspondence parts. In the etching process, the etching of the outside of the arm correspondence part and etching in the two or more openings are started together, and the etchings are continued until the region in the major surface of the piezoelectric wafer which has been in contact with the middle wall correspondence part is etched from one edge part to the other edge part of the middle wall correspondence part.

Advantageous Effects of Invention

According to the above configuration or procedure, the crystal impedance can be lowered.

BRIEF DESCRIPTION OF DRAWINGS

FIG. 1 A disassembled perspective view schematically showing the configuration of a crystal unit according to an embodiment of the present invention.

FIG. 2A is a plan view showing an internal portion of the crystal unit in FIG. 1, FIG. 2B is a cross-sectional view taken along the line IIb-IIb in FIG. 2A, and FIG. 2C is a cross-sectional view taken along the line IIc-IIc in FIG. 2A.

FIG. 4A is a plan view showing a portion in the crystal in FIG. 1 which corresponds to a region IVa in FIG. 2A, and FIG. 4B is an enlarged view in a region IVb in FIG. 4A.

FIG. 5A is a cross-sectional view taken along the line Va-Va in FIG. 4B, and FIG. 5B is a cross-sectional view taken along the line Vb-Vb in FIG. 4B.

FIG. 7A to FIG. 7C are schematic cross-sectional views showing a continuation of FIG. 6B.

DESCRIPTION OF EMBODIMENTS

Figure 3:
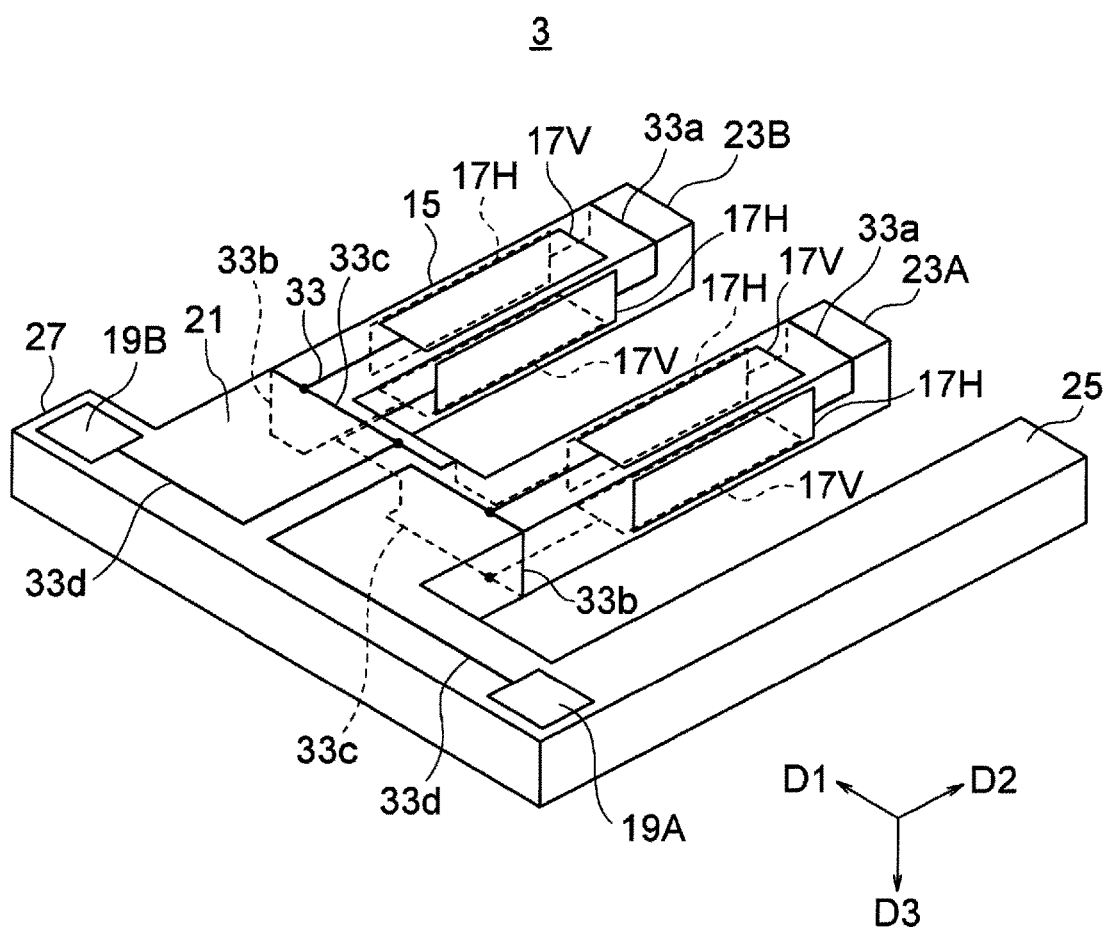
FIG. 3 A schematic perspective view showing an example of interconnects of the crystal vibration element in FIG. 1.

Below, an embodiment of the present invention will be explained with reference to the drawings. Note that, the diagrams used in the following description are schematic ones. Dimensions, ratios, etc. on the drawings do not always coincide with actual ones.

When explaining details of the shape of the crystal, error which shows a certain tendency that occurs due to anisotropy of the crystal with respect to the etching (such as systematic error) will sometimes be considered. On the other hand, error which is not replicable (such as accidental error) will be basically ignored.

In the drawings, an orthogonal coordinate system comprised of a D1-axis, D2-axis, and D3-axis will sometimes be attached for convenience. Further, in the crystal unit etc. which will be explained below, any direction may be defined as the vertical direction or horizontal direction. However, for convenience, sometimes the positive side of the D3-axis direction will be defined as the upper part, and use will be made of the "upper surface", "lower surface", and other terms. Further, the simply used term "viewed by a plan view" means "viewed in the D3-axis direction"

With respect to configurations which are the same or similar to each other, like the "first vibrating arm 23A" and "second vibrating arm 23B", common terms (vibrating arms) will sometimes be assigned with different numbers (first and second) and capital letters of the alphabet which are different from each other (A and B) will sometimes be added to the reference signs. Further, in this case, sometimes the numbers and capital letters of the alphabet will be omitted and two parts will not be distinguished like the "vibrating arms 23".

<Schematic Configuration of Crystal Unit>

FIG. 1 is a disassembled perspective view schematically showing the configuration of a crystal unit 1 according to an embodiment of the present invention. FIG. 2A is a plan view showing the internal portion of the crystal unit 1. FIG. 2B is a cross-sectional view taken along the line IIb-IIb in FIG. 2A. FIG. 2C is a cross-sectional view taken along the line IIc-IIc in FIG. 2A.

The crystal unit 1, for example, as particularly shown in FIG. 1, is mainly configured by three members. That is, the crystal unit 1 has a crystal vibration element 3 (below, "crystal" will be sometimes omitted) which vibrates by application of voltage and an element mounting member 5 and lid member 7 for packaging the vibration element 3.

When the vibration element 3 is accommodated in the box-shaped element mounting member 5, and the lid member 7 is covered over the element mounting member 5, the crystal unit 1, for example, as a whole, forms a schematically thin cuboid shape. The internal portion of the element mounting member 5 is for example sealed by the lid member 7. Further, the internal portion is for example evacuated or a suitable gas (for example nitrogen) is sealed in it.

The dimensions of the crystal unit 1 may be suitably set. For example, in relatively small one, the width (D1-axis direction) is 0.40 mm to 3.20 mm, the length (D2-axis direction) is 0.65 mm to 5.00 mm, and the thickness (D3-axis direction) is 0.2 mm to 1.2 mm.

The crystal unit 1 is for example arranged with the lower surface (surface on the negative side in the D3-axis direction) facing the mounting side of a not shown circuit board or the like and is mounted on the mounting side by bumps made of solder or the like. Further, the crystal unit 1 receives voltage applied from an oscillation circuit provided on the circuit board and contributes to generation of an oscillation signal.

Below, generally, the basic configuration relating to the generation of vibration and the mounting structure of the vibration element 3 on the element mounting member 5 will be explained in order, then the shapes of detailed parts of the vibration element 3 (more specifically the later explained vibrating arms 23) will be explained.

<Fundamental Configuration Concerned with Generation of Vibration>

(Schematic Configuration of Vibration Element)

The vibration element 3 for example has a crystal blank 15, a first excitation electrode 17V and second excitation electrode 17H (FIG. 1) for applying voltage to the crystal blank 15, and a first element terminal 19A and second element terminal 19B (FIG. 2B) for mounting the vibration element 3 on the element mounting member 5.

Other than the above, the vibration element 3 has suitable interconnects (explained later). Further, although not particularly shown, the vibration element 3 may have a metal film for adjusting the frequency (for adjusting the weight of the later explained vibrating arms 23) as well.

(Basic Shape of Crystal Blank: Base Part and Vibrating Arms)

The crystal blank 15 is formed to a substantially constant thickness (D3-axis direction) as a whole and has a suitable planar shape. Specifically, the crystal blank 15 is a so-called tuning fork type and, as fundamental configuration, has a base part 21 and a first vibrating arm 23A and second vibrating arm 23B extending in parallel from the base part 21. The pair of vibrating arms 23 are portions vibrating by application of voltage by the excitation electrodes 17, while the base part 21 is the portion supporting those vibrating arms 23.

The base part 21 may be given a suitable shape. For example, it generally forms a thin cuboid shape. Note that, the upper surface, lower surface, or side surfaces may be curved. The base part 21 preferably is shaped schematically plane-symmetric relative to a D2-D3 plane passing through the center and schematically plane-symmetric relative to a D1-D2 plane passing through the center. Further, the relative sizes in the D1-axis direction, D2-axis direction, and D3-axis direction of the base part 21 may be suitably set. In the illustrated example, the base part 21 forms a plate shape having the D3-axis direction as the thickness direction. However, the size in the D3-axis direction may be made larger than the size in the D1-axis direction and/or D2-axis direction as well.

The pair of vibrating arms 23, when viewed by a plan view, linearly extend from the base part 21 so as to stand in a line (for example parallel) relative to each other. The roots of the pair of vibrating arms 23 are for example positioned near the end parts of the base part 21 on the two sides in the D1-axis direction. The shapes (including dimensions) of the pair of vibrating arms 23 are for example schematically the same as each other. The pair of vibrating arms 23 may be given line-symmetric shapes except the shape caused by the anisotropy of the crystal with respect to the etching (explained later) as well. The shape of the transverse surface of each vibrating arm 23 (cross-section perpendicular to the D2-axis) is for example schematically rectangular except for the shape of the later explained fine parts. Further, the shape and area of the transverse surface are schematically constant in the longitudinal direction of each vibrating arm 23. Note, in the tip part of each vibrating arm 23, by making the area of the transverse surface large in the D1 axis direction or the like, the vibrating arm 23 may be given a so-called hammer shape as well.

The length (D2-axis direction) and width (D1-axis direction) of each vibrating arm 23 are set in accordance with the frequency etc. which are requested from the vibration element 3 as is well known. The thickness (D3-axis direction) of each vibrating arm 23 may be suitably set from the viewpoints of securing the strength, suppressing spurious emissions, and so on.

The crystal blank 15 is for example cut so that, when rotating the Y-axis (mechanical axis) and Z-axis (optical axis) around the X-axis (electrical axis) within a range of about −5° to +5° and defining them as the Y'-axis and Z'-axis, the X-axis becomes the direction of lineup of the pair of vibrating arms 23 (D1-axis direction), the Y'-axis becomes the direction of extension of the vibrating arms 23 (D2-axis direction), and the Z'-axis becomes the thickness direction of the vibrating arms 23 (D3-axis direction).

(Configuration of Excitation Electrodes)

The excitation electrodes 17 are for example configured by conductive layers provided on the surfaces of the vibrating arms 23. Specifically, first excitation electrodes 17V are provided on the upper and lower surfaces (the surfaces on the positive side of the D3-axis direction and the surfaces on the negative side of the D3-axis direction) of the vibrating arms 23. Further, second excitation electrodes 17H are provided on the side surfaces on the two sides (the surfaces on the positive side of the D1-axis direction and the surfaces on the negative side of the D1-axis direction) at the vibrating arms 23. That is, in each vibrating arm 23, four excitation electrodes 17 in total are provided on the four surfaces in total of the upper and lower surfaces and side surfaces on the two sides.

The planar shapes of the excitation electrodes 17 are for example roughly rectangle shapes having the direction of extension of the vibrating arms 23 as the longitudinal direction. The widths of the excitation electrodes 17 are for example determined as schematically the widenesses over the widths of the surfaces (upper and lower surfaces or side surfaces) of the vibrating arms 23 provided with the excitation electrodes 17. Note, so as not to cause a short-circuit between a first excitation electrode 17V and a second excitation electrode 17H, the width of at least one excitation electrode 17 between them (the first excitation electrode 17V in the present embodiment) is made a bit smaller than the width of the surface provided with that excitation electrode 17. The lengths of the excitation electrodes 17 (D2-axis direction) are for example suitably set so as to become as long as possible within a range where they are shorter than the lengths of the vibrating arms 23. The positions of the excitation electrodes 17 on the base part 21 side are for example the roots of the vibrating arms 23.

Note that, the conductive layers configuring the excitation electrodes 17 and other later explained conductive layers (pads 11, external terminals 13, element terminals 19, etc.) are for example metal layers. The conductive layers may be configured by single layers (single types of material) or may be configured by a plurality of layers.

(Potentials of Excitation Electrodes)

In each vibrating arm 23, for example, the two first excitation electrodes 17V are set at potentials the same as each other, the two second excitation electrodes 17H are set at potentials the same as each other, and AC voltages are applied between the first excitation electrodes 17V and the second excitation electrodes 17H. Due to this, each vibrating arm 23 vibrates in the D1-axis direction.

Further, between the pair of vibrating arms 23, for example, the first excitation electrode 17V of the first vibrating arm 23A and the second excitation electrode 17H of the second vibrating arm 23B are set at the same potentials, and the second excitation electrode 17H of the first vibrating arm 23A and the first excitation electrode 17V of the second vibrating arm 23B are set at the same potentials. Due to this, the pair of vibrating arms 23 vibrate line-symmetrically relative to each other when viewed by a plan view.

(Interconnect Structure of Vibration Element)

The relationships among the excitation electrodes 17 as described above and application of voltage to the excitation electrodes 17 are for example realized by connection of the excitation electrodes 17 to each other and connection between the excitation electrodes 17 and the element terminals 19 by interconnects configured by conductive layers provided on the surface of the crystal blank 15. For example, this is as follows.

FIG. 3 is a schematic perspective view showing an example of interconnects 33 of the vibration element 3. Note that, the illustrated example is in the final analysis just one example. Various interconnects are possible other than this.

In the illustrated example, the two second excitation electrodes 17H of the vibrating arms 23 are connected to each other by front end side interconnects 33a provided on the front end sides of the vibrating arms 23. The two first excitation electrodes 17V of the vibrating arms 23 are connected to each other by outer side interconnects 33b passing over the side surfaces of the base part 21 on the two sides in the D1-axis direction. The second excitation electrode 17H which is positioned on the side surface at the inner side of each vibrating arm 23 (between the pair of vibrating arms 23) and the first excitation electrode 17V of the upper surface or lower surface of the other vibrating arm 23 are connected to each other by an inner side interconnect 33c over the surface of the base part 21 (the positive side of the D2-axis direction) which is located on the vibrating arm 23 side. The inner side interconnects 33c or outer side interconnects 33b are connected to element terminals 19 by terminal-use interconnects 33d which extend on the lower surface of the base part 21 (the negative side of the D3-axis direction). To the pair of element terminals 19, an AC voltage is applied through the element mounting member 5.

<Configuration Relating to Mounting of Vibration Element>

The configuration relating to the mounting of the vibration element 3 is for example as follows. However, various known configurations may be applied for the configuration relating to the mounting of the vibration element 3. The configuration explained below is only one example.

(Shape for Mounting in Crystal: Support Arm and Projection Part)

As shown in FIG. 1 to FIG. 3, the crystal blank 15, in addition to the base part 21 and vibrating arms 23 described above, has a support arm 25 and projection part 27. These support arm 25 and projection part 27 are portions contributing to the mounting of the crystal blank 15 with respect to the element mounting member 5 by for example provision of element terminals 19.

The support arm 25 for example extends from the base part 21 to the lateral side (negative side of the D1-axis direction), and then bends and extends in a line (for example parallel) relative to the pair of vibrating arms 23. The shape, dimensions, etc. of the support arm 25 may be suitably set. Note that, the root of the support arm 25 is preferably separated from the roots of the vibrating arms 23 as much as possible. In the illustrated example, the support arm 25 extends outward from the end part in the side surface (surface facing the D1-axis direction) of the base part 21 on the side opposite to the vibrating arms 23 (negative side of the D2-axis direction).

The projection part 27 for example projects from the base part 21 to the side opposite to the side of extension of (the root portion of) the support arm 25 from the base part 21. The shape, dimensions, etc. of the projection part 27 may be suitably set. Note that, the projection part 27, in the same way as the root of the support arm 25, is preferably separated from the roots of the vibrating arms 23 as much as possible. In the illustrated example, the projection part 27 extends outward from the end part on the opposite side to the vibrating arms 23 in the side surface of the base part 21 on the side opposite to the side surface from which the support arm 25 extends.

(Configuration of Element Terminals)

As shown in FIG. 2B to FIG. 3, the element terminals 19 are for example configured by conductive layers provided on the support arm 25 and the projection part 27. Specifically, for example, the first element terminal 19A is provided on the lower surface of the bent part of the support arm 25 (surface on the negative side of the D3-axis direction). The second element terminal 19B is provided on the lower surface of the projection part 27 (surface on the negative side of the D3-axis direction). The planar shapes and areas of the element terminals 19 may be suitably set.

(Configuration of Package)

As shown in FIG. 1 and FIGS. 2A to 2C, the element mounting member 5 for example has the base 9 which becomes the main member of the element mounting member 5, pads 11 for mounting the vibration element 3 (FIG. 2A to FIG. 2C), and external terminals 13 for mounting the crystal unit 1 on a not shown circuit board or the like.

The base 9 is made of an insulating material and has a recess 5a for accommodating the vibration element 3. The insulating material configuring the base 9 is for example a ceramic or resin. Note that, the base 9 may be configured by a plurality of members as well. The bottom surface of the recess 5a which becomes the mounting surface of the vibration element 3 is for example planar.

The pads 11 are for example configured by conductive layers provided on the bottom surface of the recess 5a. For example, two pads (a pair of) pads 11 are provided. The two pads 11 are for example positioned on the same plane (bottom surface of the recess 5a) with the same thicknesses as each other. The planar shapes and areas of the pads 11 may be suitably set.

The positions of the pair of pads 11 are suitably set in accordance with the configuration of the vibration element 3. In the present embodiment, the pair of pads 11 are positioned at two corner portions at one short side (negative side of the D2-axis direction) in the schematically rectangular bottom surface of the recess 5a.

The external terminals 13 are for example configured by conductive layers provided on the lower surface of the base 9 (surface on the negative side of the D3-axis). The number, positions, planar shapes, and areas of the external terminals 13 may be suitably set. For example, the external terminals 13 are provided at each of four corners of the lower surface of the base 9. Note that, in the present embodiment, at least two (a pair of) external terminals 13 only have to be provided corresponding to the number 2 of the pads 11.

Although not particularly shown, the pair of pads 11 and two among the four external terminals 13 are connected to each other by interconnect conductors provided on the base 9. The interconnect conductors are for example configured by layered conductors and/or via conductors provided inside the base 9.

The lid member 7 is for example configured by a metal and is joined to the upper surface of the element mounting member 5 by seam welding or the like.

(Mounting of Vibration Element with Respect to Package)

As shown in FIG. 2A to FIG. 2C, the vibration element 3 is for example arranged so as to face the bottom surface of the recess 5a in the element mounting member 5 and is electrically connected and fixed to the element mounting member 5 (that is mounted) by the pair of element terminals 19 and the pair of pads 11 being joined. These are bonded for example by bonding bumps 29 which lie between the element terminals 19 and the pads 11. The bonding bumps 29 are for example made of a conductive adhesive. The conductive adhesive is for example made of a resin in which a conductive filler is mixed.

Further, the vibration element 3 is supported upon the bottom surface of the recess 5a on the side nearer the front end than the bent part of the support arm 25. Specifically, for example, a supporting bump 31 is provided on the bottom surface of the recess 5a. The lower surface of the front end part of the support arm 25 abuts against the supporting bump 31 to be supported. The supporting bump 31 may be for example configured by a conductive adhesive or insulating resin and may be made of the same material as that for the bonding bumps 29. Further, the supporting bump 31 may not only abut against the support arm 25, but also join the support arm 25 and the bottom surface of the recess 5a.

Note that, unlike the illustrated example, the pair of element terminals 19 may be provided on the front end and bent part of the support arm 25 and the bonding bumps 29 and pads 11 may be provided corresponding to those positions. In this case, the projection part 27 may be supported by the supporting bump 31, or the projection part 27 need not be provided, and the corner portion of the base part 21 may be supported by the supporting bump 31.

<Shapes of Detailed Parts of Vibrating Arms>

(Outline of Groove and Wall)

FIG. 4A is a plan view showing a portion in the crystal blank 15 which corresponds to the region IVa in FIG. 2A. FIG. 4B is a enlarged view in the region IVb in FIG. 4A. FIG. 5A is a cross-sectional view taken along the line Va-Va in FIG. 4B. FIG. 5B is a cross-sectional view taken along the line Vb-Vb in FIG. 4B. Note that, in these diagrams, the first vibrating arm 23A is shown. However, also the shape of the second vibrating arm 23B is the same.

Each vibrating arm 23 has two grooves 41 extending in the direction of extension of the vibrating arm 23 (D2-axis direction) in each of the upper surface and lower surface. Each groove 41 for example has an equal length as that of the first excitation electrode 17V in the D2-axis direction.

Note that, in the following explanation, irrespective of being either the upper surface or lower surface of the vibrating arm 23, the bottom side of each groove 41 will be defined as the lower part, the opening side of the groove 41 will be defined as the upper part, and "high", "low", or other terms will be sometimes used.

Further, the shape of the upper surface and the shape of the lower surface in the vibrating arm 23 are formed by the same technique (etching) based on the same idea as each other. Therefore, in the following description, basically the explanation will be given on only (any) one of the upper surface and lower surface.

By the formation of two grooves 41, each vibrating arm 23 has a pair of outer walls 45 positioned on the two sides of the two grooves 41 and a middle wall 47 positioned between the two grooves 41. The pair of outer walls 45 and middle wall 47 rise up relative to an intermediate layer 43 (FIG. 5A and FIG. 5B) positioned at the center of the vertical direction (D3-axis direction) of the vibrating arm 23 and extend in the direction of extension of the vibrating arm 23 (D2-axis direction).

Further, the vibrating arm 23, in each groove 41, has one or more (two or more in the present embodiment) transverse walls 49 (FIG. 4A, FIG. 4B, and FIG. 5B) which traverse each groove 41. From another viewpoint, the groove 41 is configured by a plurality of recesses 51 (notation is shown FIG. 4A and FIG. 4B) which are arranged in the longitudinal direction of the vibrating arm 23.

By forming the grooves 41, for example, the crystal impedance (CI) falls. Specifically, for example, this is as follows. The first excitation electrode 17V is provided also on the inner surfaces of the two grooves 41. For example, the first excitation electrode 17V is provided over portions of the top faces of the pair of outer walls 45, the inner walls of the grooves 41, and the middle wall 47. Accordingly, the first excitation electrode 17V faces the second excitation electrode 17H while sandwiching the outer wall 45 therebetween in the D1-axis direction. As a result, for example, in a vector of an electric field formed by application of voltage with respect to the first excitation electrode 17V and second excitation electrode 17H, compared with a case where the groove 41 is not formed, the component along the D1-axis direction becomes large, therefore the vibrating arm 23 efficiently vibrates, and the CI falls.

On the upper surface or lower surface of each vibrating arm 23, by forming two grooves 41 or providing the transverse walls 49 or the like rather than forming one groove, for example the method of production of the crystal blank 15 is facilitated. Specifically, in a case where the crystal blank 15 is etched through a mask, by making the openings of the mask corresponding to the grooves 41 small, penetration of the grooves 41 to become slits can be suppressed. This will be explained later.

In the present embodiment, one of characteristic features resides in that the middle wall 47 is low and thin compared with the outer walls 45. The concrete shapes of the portions in the vibrating arms 23 are for example as follows.

(Configuration of Outer Walls)

The shape (including dimensions) of the transverse surface of each outer wall 45 (cross-section perpendicular to the D2-axis as shown in FIG. 5A) is for example schematically constant over its longitudinal direction (D2-axis direction). Note, the influence exerted upon the etching of the outer walls 45 by the transverse walls 49 is excluded from this. In the following explanation of the outer walls 45, so far as it is not particularly indicated, the influence by the transverse walls 49 will be ignored.

The heights (positions in the D3-axis direction) of the apex parts (top faces) of the outer walls 45 are the same as each other between the pair of outer walls 45. In the following description, the dimensions relating to the middle wall 47 will be sometimes explained using the positions of the apex parts of the outer walls 45 as the standard. Note that, the top faces of the outer walls 45 are basically planar perpendicular to the D3-axis and are not limited to a crystal plane. In a case where the widths (D1-axis direction) of the top faces of the outer walls 45 are small and/or under etching is large or the like, the highest positions of the outer walls 45 may be defined as the apex parts of the outer walls 45.

The shapes (including dimensions) of the transverse surfaces of the outer walls 45 are schematically the same as each other between the pair of outer walls 45. The term "same" referred to here basically takes into account error (like systematic error) showing a certain tendency which is caused by the anisotropy with respect to the etching of the crystal. Further, the term "the shapes are the same" referred to here does not mean the shapes which are plane-symmetric with respect to the D2-D3 plane passing through the center of the vibrating arms 23, but means the shapes superimposed on each other by parallel movement. That is, between the pair of outer walls 45, the shapes of the wall surfaces on the negative side of the D1-axis are the same as each other, and the shapes of the wall surfaces on the positive side of the D1-axis are the same as each other.

Specifically, for example, between the pair of outer walls 45, the same crystal planes appear as their wall surfaces, and the thicknesses t1 (D1-axis direction, FIG. 5A) at the same heights (same positions in the D3-axis direction) are schematically the same as each other.

A crystal plane is a plane which is formed at an angle inherent to the crystal relative to the X-axis to Z-axis due to geometric regularity of the crystal lattice. Note that, in the drawings used in the explanation of the present embodiment, for convenience of illustration, the number and angles of the crystal planes are not correctly shown. The number and angles of the crystal planes are defined according to the relative relationships between the X-axis to Z-axis and the D1-axis to D3-axis, orientation of etching, and so on.

In the case where the X-axis is defined as the D1-axis, the Y'-axis is defined as the D2-axis, and the Z'-axis is defined as the D3-axis as explained above, and wet etching is carried out through a mask perpendicular to the D3-axis direction, the outer walls 45 as a whole roughly speaking form asymmetric shapes where the thicknesses t1 at the roots increase toward one side of the D1-axis direction (negative side of the D1-axis direction in the illustrated example) relative to the thicknesses t1 at the apex parts. Further, the outer walls 45 roughly speaking have outer wall upper parts 45*a* (FIG. 5A) in which the change of the thickness t1 relative to the position in the D3-axis direction is relatively small and outer wall lower parts 45*b* (FIG. 5A) in which the change of the thickness t1 relative to the position in the D3-axis direction is larger than that of the outer wall upper parts 45*a*. Both of the outer wall upper parts 45*a* and the outer wall lower parts 45*b* form schematically asymmetric shapes where the root sides increase toward the one side of the D1-axis direction relative to the apex part sides.

However, in the cross-section exemplified in FIG. 5A, the pair of outer walls 45 differ in the shapes of the wall surfaces on the root sides on the positive side of the D1-axis direction. This is because, on the outer wall 45 on the negative side of the D1-axis direction, the transverse walls 49 exert an influence upon the etching for forming the wall surface of the outer wall 45 on the positive side of the D1-axis direction. On the other hand, on the outer wall 45 on the positive side of the D1-axis direction, the transverse walls 49 do not exert an influence upon the etching for forming the wall surface of the outer wall 45 on the positive side of the D1-axis direction. Specifically, for example, between the pair of outer walls 45, a portion of the crystal plane which forms the transverse walls 49 appears at the root only on the outer wall 45 which is located on the negative side of the D1-axis direction. Note that, this crystal plane may be grasped as a crystal plane forming the transverse wall 49 and not a component of the outer wall 45. When grasped in this way, the pair of outer walls 45 may have shapes the same as each other in the cross-section exemplified in FIG. 5A as well.

The pair of outer walls 45 are different from each other in the point that either of the positive side or negative side in the D1-axis direction becomes adjacent to a groove 41. As a result, sometimes the pair of outer walls 45 do not become the same as described above in the vicinity of the bottoms of the grooves 41 since for example the state of contact with the etching solution are different. Further, in the vicinity of the bottoms of the grooves 41, error which is not replicable (such as incidental error) is relatively easily caused. Further, in a case where the influence of the transverse walls 49 appears on the root sides of the outer walls 45 as described above, it is not always easy to clearly differentiate the outer wall 45 and the portion influenced by the transverse walls 49. Accordingly, in the judgment of whether the shapes of the pair of outer walls 45 (thicknesses t1 at the same height) are the same, the shapes on the root sides may be ignored. For example, it may be judged whether the shapes of the pair of outer walls 45 are the same as each other based on the shapes from approximately the middles of the outer wall lower parts 45b to the upper parts. Otherwise, for example, when defining the depth from the apex part of an outer wall 45 to the deepest portion of a groove 41 as Dp0, it may be judged whether the shapes of the pair of outer walls 45 are the same as each other based on the shapes within a range from the apex parts of the outer walls 45 up to about ¾ of Dp0.

The problem of which ranges of the outer walls 45 to compare as described above may be considered to be a problem of definition, i.e., what extent from an apex part is to be grasped as an outer wall 45. That is, a range from the apex part of the outer wall 45 up to the vicinity of the middle of the outer wall lower part 45b or a range from the apex part of the outer wall 45 up to about ¾ of Dp0 may be defined as the outer wall. Depending on the shape (or residue) of the bottom portion of the groove 41, the bottom face of the groove 41 looks like the outskirts of the outer wall 45, therefore sometimes specifying the range of an outer wall 45 is difficult. The definition as described above is effective in such a case.

Further, the shapes of the outer walls 45 (thicknesses t1 at the same height) being the same as referred to here ignores error which is not replicable (such as incidental error). The magnitude of the error differs according to the dimensions of the outer walls 45, concrete conditions of etching, and so on. As an example, in a case where the thickness t1 at a position in the vicinity of the root of the outer wall 45 (for example in the vicinity of the middle of the outer wall lower part 45b) is 8 μm to 11 μm, a difference of about 2 μm may be caused at the maximum (for example a case where an error of +1 μm and −1 μm occurs with respect to the designed value) between the pair of outer walls 45 at this position. Naturally, when performing more precise etching, this error can be made small.

(Configuration of Middle Wall)

The shape (including dimensions) of the transverse plane of each middle wall 47 (cross-section perpendicular to the D1-axis as shown in FIG. 5A) is for example substantially constant over its longitudinal direction (D2-axis direction). However, the influence of the transverse walls 49 exerted upon the etching of the middle wall 47 is not limited to this. In the following explanation for the middle wall 47, so far as it is not particularly indicated otherwise, the influence of the transverse walls 49 will be ignored.

In the middle wall 47, the position of the apex part is lower (is positioned on the bottom side of the groove 41 in the D3-axis direction) than the position of the apex parts of the outer walls 45. Note that, the apex part of the middle wall 47 is not limited to a planar shape perpendicular to the D3-axis unlike the apex parts of the outer walls 45. For example, this is configured by one or more crystal planes appearing by etching. The apex part of the middle wall 47 may be defined as the highest position of the middle wall 47.

Further, the middle wall 47 is thinner compared with the outer wall 45. Here, the thickness t1 of the outer wall 45 and the thickness t2 of the middle wall 47 (FIG. 5A) are not always constant from the roots to the apex parts. Accordingly, the term "the middle wall 47 is thin compared with the outer wall 45" referred to here means that the thickness t2 of the middle wall 47 is thinner than the thickness t1 of the outer wall 45 over substantially all or most of the part from the root to the apex part in the middle wall 47 when comparing the thicknesses at the same height (same position in the D3-axis direction).

Note, in the vicinity of the roots of these walls, for example, as explained for the shapes of the pair of outer walls 45, a portion of the bottom face of the groove 41 looks like the outskirts of the middle wall 47 or outer walls 45 and then it is difficult to specify the boundary of the middle wall 47 or outer walls 45, or the influence of error which is not replicable is large. Further, the influence by the transverse walls 49 appears on the root of the middle wall 47 on the positive side of the D1-axis direction, while the influence by the transverse walls 49 does not appear on the root on the positive side of the D1-axis direction in the outer wall 45 on the positive side of the D1-axis direction between the pair of outer walls 45.

Accordingly, the thickness in the vicinity of the root may be ignored. For example, it may be judged whether the middle wall 47 is thinner than the outer walls 45 based on the thickness from the vicinity of the middle of the outer wall lower part 45b to the upper part. Alternatively, when defining the depth from the apex part of the middle wall 47 to the deepest portion of the groove 41 as Dp2, it may be judged whether the middle wall 47 is thinner than the outer walls 45 based on the thickness in the range from the apex part of the middle wall 47 to about ¾ of Dp2.

The problem of which ranges of the middle wall 47 and outer walls 45 are to be compared as described above may be grasped as a problem of definition, i.e., in the same way as the comparison between the outer walls 45, what extent from the apex part is to be grasped as the middle wall 47 (or outer walls 45). For example, the range from the vicinity of the middle of the outer wall lower part 45b to the upper part or the range from the apex part of the middle wall 47 to about ¾ of Dp2 may be defined as the middle wall as well.

Further, concerning the influence by the transverse walls 49, in the same way as the comparison between the outer walls 45, the portion which is generated according to the influence by the transverse walls 49 (for example the crystal plane composing the transverse walls 49) may be grasped as neither a component of the middle wall 47 nor a component of the outer wall 45.

The shape of the transverse plane of the middle wall 47 is, when excluding the vicinity of the apex part, for example, a shape where the wall surfaces on the two sides of the D1-axis direction in the outer wall 45 approach each other. That is, when the wall surface of the middle wall 47 on the positive side of the D1-axis direction is moved parallel in the D1-axis direction, this roughly coincides with a portion of the wall surface on the positive side of the D1-axis direction in the outer wall 45. Further, this is true also for the wall surface on the negative side of the D1-axis direction. Further, from another viewpoint, the middle wall 47 has a wall surface of the same crystal plane as the crystal plane which appears as the wall surface of an outer wall 45 (note, the wall surface within a range not higher than the apex part of the middle wall 47). Further, after providing such wall surfaces having the same shapes, the distance (thickness) between the wall surfaces at the same height becomes shorter in the middle wall 47 than that in the outer walls 45.

Note, in the vicinity of the bottom of the groove 41, as explained also in the description of comparison of thicknesses of the middle wall 47 and the outer walls 45, for example, the influence by the transverse walls 49 is apt to appear or error which is not replicable (such as incidental error) is relatively easily caused. Accordingly, in the same way as the comparison of thickness, it may be judged whether the shapes of the wall surfaces are the same between the middle wall 47 and an outer wall 45 while excluding the influence by the transverse walls 49 or it may be judged whether the shapes of wall surfaces are the same between the middle wall 47 and the outer wall 45 based on the shape of wall surface from the vicinity of the middle of the outer wall lower part 45b to the upper part or on the shape of wall surface within the range from the apex part of the middle wall 47 to about ¾ of Dp2 or the portions within such ranges may be defined as the middle wall and the outer wall to compare the two.

(Configuration of Transverse Walls)

As shown in FIG. 4A and FIG. 4B, the transverse walls 49 for example extend from one of an outer wall 45 and middle wall 47 to the other of them when viewed by a plan view. The front ends thereof do not reach the other of the outer wall 45 and middle wall 47. Accordingly, the plurality of recesses 51 which are arranged along a vibrating arm 23 (D2-axis) and configure the grooves 41 are linked with each other.

By configuring the structure in this way, for example, in the first excitation electrode 17V, it becomes easy to secure the conduction between the portions which are arranged in the recesses 51. Note, the transverse walls 49 may extend from one of the outer wall 45 and middle wall 47 until they reach the other of the walls as well.

Further, considering the anisotropy with respect to the etching of the crystal (direction of residue) and so on, for example the transverse walls 49 are provided so as to incline relative to the direction (D1-axis direction) perpendicular to the vibrating arm 23 when viewed by a plan view. Note, the transverse walls 49 may be perpendicular to the vibrating arm 23 as well.

Further, the front ends of the transverse walls 49 when viewed by a plan view (the portions at which the recesses 51 are linked with each other) are positioned on the same sides (the positive side of the D1-axis direction in the illustrated example) between the two grooves 41 relative to the width direction (D1-axis direction) of the grooves 41. That is, in the illustrated example, in the groove 41 on the negative side of the D1-axis direction between the two grooves 41, the transverse walls 49 extend from the outer wall 45 toward the middle wall 47. In the groove 41 on the positive side of the D1-axis direction between the two grooves 41, the transverse walls 49 extend from the middle wall 47 toward the outer wall 45.

By configuring the structure in this way, for example, as shown in FIG. 5B, in the vicinity of the transverse walls 49 as well, the shapes which are formed on the inner walls of the grooves 41 due to the anisotropy of the crystal with respect to the etching can be made substantially the same between the two grooves 41. Note, in the transverse walls 49, the opposite sides in the D1-axis direction may be defined as the front ends as well.

The heights (positions in the D3-axis direction) of the apex parts (highest positions) of the transverse walls 49 are for example higher than the height of the apex part of the middle wall 47. Further, the heights of the apex parts of the transverse walls 49 are for example equal to the heights of the apex parts of the outer walls 45 or lower than the latter. Note that, when the heights of the apex parts of the transverse walls 49 are equal to the heights of the apex parts of the outer walls 45, the top faces basically form planar states perpendicular to the D3-axis. Note, in the same way as the top faces of the outer walls 45, a case where the area thereof is small and so on are excluded.

The wall surfaces or front end surfaces of the transverse walls 49 (the surfaces facing the wall surface of the middle wall 47), in the same way as the wall surfaces of the outer walls 45 and middle wall 47, are basically configured by the crystal plane. Note that, the front end surfaces of the transverse walls 49, unlike the wall surfaces of the outer walls 45 and middle wall 47, receive the an etching action from the D2-axis direction, therefore the same crystal plane as the crystal plane which appears on the wall surfaces of the outer walls 45 and middle wall 47 does not always appear. That is, the shapes of the front end surfaces of the transverse walls 49 do not always become the same as the shapes of the wall surfaces of the outer walls 45 and middle wall 47. In FIG. 5B, for convenience, the front end surfaces are illustrated by vertical walls ignoring actual shapes and dimensions of the front end surfaces of the transverse walls 49.

The thicknesses t3 of the transverse walls 49 (FIG. 4B) not only differ according to their heights (positions in the D3-axis direction), but also differ according to the positions when viewed by a plan view (roughly the positions in the D1-axis direction). Residue is formed in the corner portions formed together with the outer walls 45 or middle walls 47. Therefore, it is difficult to simply compare the thicknesses t3 with that of the outer walls 45 or middle wall 47. Note that, when assuming that the diameter of the openings of the mask for etching is reflected in the thickness of the wall (if the systematic error and incidental error are ignored), for example the thicknesses t3 of the transverse walls 49 are thicker than the thickness t2 of the middle wall 47 and are equal to the thickness t1 of the outer wall 45 or thinner than the thickness t1.

(Configuration of Grooves)

As understood from the explanation of the configurations of various types of walls, the shapes (including dimensions) of the transverse planes of the grooves 41 (cross-sections perpendicular to the D2-axis as shown in FIG. 5A) are for example substantially constant over their longitudinal directions (D2-axis direction) except the positions where the transverse walls 49 are arranged. In the following description, the shapes of the grooves 41 will be sometimes explained leaving aside the positions of arrangement of the transverse walls 49.

Note that, FIG. 5B exemplifies a case where the depths Dp0 (FIG. 5A) of the deepest portions of the grooves 41 at the positions where transverse walls 49 are not arranged are maintained also at the positions of arrangement of transverse walls 49. However, the transverse walls 49 may extend between the outer walls 45 and the middle walls 47 (the grooves 41 may be interrupted) as already explained. Further, even in a case where the transverse walls 49 extend from one of the middle wall 47 and outer wall 45 without reaching the other of them and the grooves 41 are formed at the positions of arrangement of the transverse walls 49 (case where portions lower than the middle wall 47 are formed at the positions of arrangement of the transverse walls 49), the depths of the deepest portions at the positions where the transverse walls 49 are not arranged need not be maintained at the positions of arrangement of the transverse walls 49 either.

As understood from the explanation of the shapes of the pair of outer walls 45 and middle wall 47, each groove (except above the middle wall 47) is basically configured by a crystal plane. Further, the shapes (including dimensions) of the two grooves 41 are basically the same as each other even considering the anisotropy with respect to the etching of the crystal. In the judgment of whether the shapes of the two grooves 41 are the same, in the same way as the outer walls 45 and middle wall 47, error which is not replicable may be ignored. Further, the judgment of whether two are the same, in the same way as the outer walls 45 and middle wall 47, may be carried out within the range from the apex part of an outer wall 45 to about ¾ of the depth Dp0, the range from the apex part of the middle wall 47 to about ¾ of the depth Dp2, or the range from the middle of the outer wall lower part 45*b* to the upper part. Further, the judgment of whether two are the same may be carried out while excluding the influence by the transverse walls 49 as well. Note that, in the present embodiment, as shown in FIG. 5B, even considering the influence by the transverse walls 49, the shapes of the two grooves 41 are the same.

(Configuration of Intermediate Layer)

The intermediate layer 43 is, for example, in a vibrating arm 23, a region between (the deepest portion of) the groove 41 in the upper surface and (the deepest portion of) the groove 41 in the lower surface and may be defined as planar. Further, in the intermediate layer 43, for example, in the end part on the above one side of the D1-axis direction (negative side of the D1-axis direction in the illustrated example), the thickness of the intermediate layer 43 (the distance from the surface of the intermediate layer 43 where the outer wall 45 on the upper surface side is provided to the surface of the intermediate layer 45 where the outer wall 45 on the lower surface side is provided) becomes thinner toward above one side of the D1-axis. However, the positions in the D1-axis direction of the groove 41 in the upper surface (approximately the deepest portion thereof) and the groove 41 in the lower surface (approximately the deepest portion thereof) may be made to deviate from each other, the positions of the two in the D3-axis direction may be made to overlap each other (the bottom sides of the two are superimposed on each other when viewed in the D1-axis direction), and the intermediate layer 43 defined as described above need not be formed.

(Relationships of Shapes Between Pair of Vibrating Arms)

The general shapes of the vibrating arms 23 not considering the anisotropy with respect to the etching of the crystal may be the same between the pair of vibrating arms 23 as already explained or may be plane symmetric. On the other hand, as understood from the explanation of the shapes of the wall surfaces of the outer walls 45 and middle wall 47, the shapes formed due to the anisotropy with respect to the etching of the crystal (type (angle) and number of the crystal planes forming the wall surface) are not plane-symmetrical shapes between the pair of vibrating arms 23, but become shapes which coincide when moved in parallel.

(Shapes of Upper and Lower Surfaces)

In the vibrating arms 23, the shape of the upper surface and the shape of the lower surface are formed by the same procedure (etching) based on the same idea. However, the orientations with respect to the crystal orientation are different from each other, therefore the crystal planes which appear by etching or the orientations of the crystal planes thereof with respect to the D1-axis to D3-axis do not always coincide. However, in a case where the X-axis is defined as D1-axis, the Y'-axis is defined as D2-axis, and the Z'-axis is defined as D3-axis and the wet etching is carried out from the two surfaces of the D3-axis, the shape on the upper surface side and the shape on the lower surface side roughly become the plane-symmetrical shapes with respect to the plane perpendicular to the D3-axis.

(Example of Dimensions of Parts)

The dimensions of the parts of the vibrating arms 23 explained above may be suitably set from the viewpoint of obtaining the desired natural frequency or required strength and/or the viewpoint of preventing the grooves 41 from becoming through holes by etching. In the following description, one example will be shown. The example of dimensions shown below shows a case where the crystal blank 15 is formed in a relatively small size. Specifically, this shows dimensions at the time when the thickness of a vibrating arm 23 (distance from the apex part of the outer wall 45 on the upper surface side to the apex part of the outer wall 45 on the lower surface side) is set to 70 μm to 120 μm.

The depths Dp0 of the deepest portions of the grooves 41 are 40 μm to 60 μm. Note that, this dimension includes the case where the positions in the D1-axis direction of the groove 41 in the upper surface and the groove 41 in the lower surface are offset from each other and the positions of the two in the D3-axis direction are made to overlap. Further, the widths of the grooves 41 (D1-axis direction) are for example 12 μm to 18 μm.

The thicknesses t1 of the outer walls 45 are for example 7 μm to 11 μm in the vicinity of the middle of the outer wall lower parts 45*b* and are 2 μm to 5 μm or ¼ to ½ of the thicknesses of the vicinity of the middle of the outer wall lower parts 45*b* in the vicinity of the middle of the outer wall upper parts 45*a*.

The thickness t2 of the middle wall 47, for example, in the vicinity of the middle of the range corresponding to the outer wall lower parts 45*b*, is 4 μm to 7 μm (where, t2<t1 at the same height) or ¼ to ¾ of the thicknesses t1 of the outer walls 45 at the same height. The depths Dp1 (FIG. 5A) from the apex parts of the outer walls 45 to the apex part of the middle wall 47 are for example 5 μm to 50 μm (note, Dp1<Dp0). Alternatively, the depth Dp1 up to the apex part of the middle wall 47 is 1/11 to 10/11 of the depths Dp0 of the deepest portions of the grooves 41.

In the transverse walls 49, the distances from the inner walls of the grooves 41 provided with the transverse walls 49 up to the front end parts of the transverse walls 49 become for example 3 μm to 5 μm.

The distance from the end part of the intermediate layer 43 on the above one side of the D1-axis direction (negative side of the D1-axis direction in the illustrated example) up to the end part on the above one side of the D1-axis direction in the outer wall 45 which is positioned on the above one side of the D1-axis direction is for example 9 μm to 13 μm. Further, the width of the outer wall upper part 45a (length of the outer wall upper part 45a in the D1-axis direction) is 2 μm to 7 μm.

<Method for Producing Crystal Unit>

(Outline of Method of Production)

The method of production of the crystal unit 1 may be the same as the known method of production of crystal unit except for the details of the method of forming the crystal blank 15. For example, roughly speaking, the crystal unit 1 is prepared by preparing the vibration element 3, element mounting member 5, and lid member 7 in parallel, mounting the vibration element 3 in the element mounting member 5, and then joining the lid member 7 to the element mounting member 5.

The vibration element 3 is for example prepared as follows. First, a wafer from which a large number of vibration elements 3 may be obtained is cut from the crystal. Next, the upper and lower surfaces of that wafer (surfaces perpendicular to the D3-axis) through the etching-use mask are etched to form crystals 15 each having the base part 21, vibrating arms 23, support arm 25, and projection part 27. After that, a conductive layer is formed on the crystals 15 through a patterning-use mask by sputtering or the like, to form the excitation electrodes 17, element terminals 19, and interconnects 33. Note that, the conductive layer may be formed in the wafer state or may be formed after dicing.

The element mounting member 5 is for example prepared as follows. First, a plurality of ceramic green sheets configuring the base 9 are punched and a conductive paste for forming the conductive layer (for example pads 11 and external terminals 13) or via conductors is coated. Next, the plurality of ceramic green sheets are laminated and fired. Due to this, a roughly box-shaped element mounting member 5 in which the conductors are arranged on insulators is prepared.

After the vibration element 3 and element mounting member 5 are prepared as described above, for example, a dispenser or the like is used to supply bonding bumps 29 made of molten conductive resin to the pads 11 of the element mounting member 5. The vibration element 3 is placed on these. Then, the bonding bumps 29 are thermally cured, whereby the pads 11 and the element terminals 19 are joined by the bonding bumps 29.

The supporting bump 31 is for example formed after firing the element mounting member 5 and before the vibration element 3 is mounted in the element mounting member 5 by supplying a conductive adhesive or insulating resin by a dispenser or the like. Note that, the supporting bump 31 may be supplied simultaneously with the bonding bumps 29 and thermally cured as well.

The lid member 7 is for example formed by punching sheet metal or the like. After mounting the vibration element 3 in the element mounting member 5, the lid member 7 is joined to the element mounting member 5 by seam welding or the like.

(Etching of Crystal)

FIG. 6A to FIG. 7C are schematic views for explaining the etching of the crystal blank 15. These diagrams, in the same way as the cross-sectional view shown in FIG. 5A, show cross-sections corresponding to one vibrating arm 23. Note, for convenience, the crystal planes etc. are shown more schematically than that in FIG. 5A.

Figure 6A:
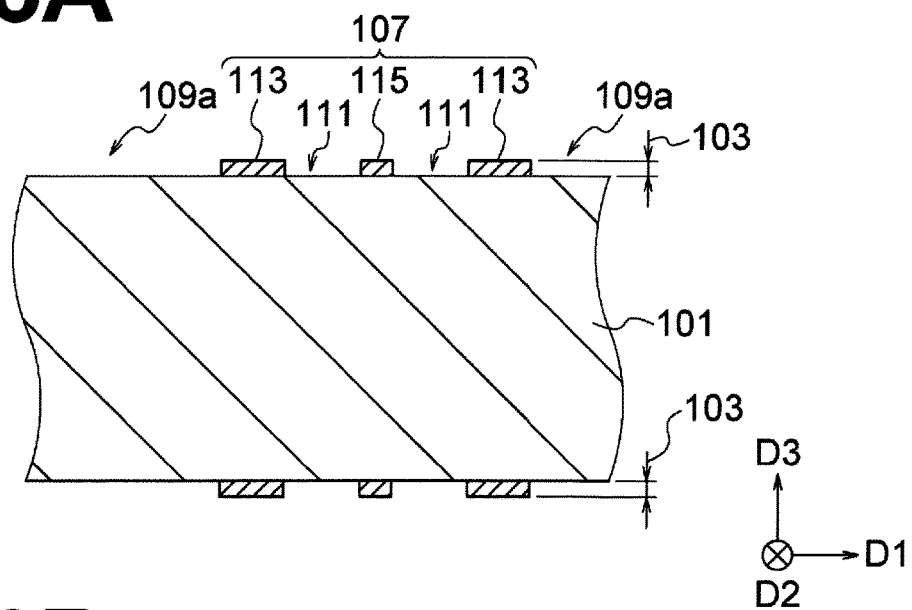
FIG. 6A and FIG. 6B are schematic cross-sectional views showing a method of production of the crystal in FIG. 1.

As shown in FIG. 6A, first, etching-use masks 103 are formed on the front and back (upper and lower surfaces) of the wafer 101 made of crystal. The method of forming the masks 103 may be the same as the known method. For example, the masks 103 are formed by forming metal films on the entire surfaces on the front and back of the wafer 101, forming masks made of a resist on those by photolithography, and etching the metal films through the masks. The masks 103 are therefore configured by a metal film and layer of resist. However, the masks 103 may also be configured by only metal films by removing the resists. Further, the metal films may be configured by single layers or may be configured by multiple layers.

As understood from the D1-axis to D3-axis, the upper and lower surfaces of the wafer 101 are the surfaces which become the upper and lower surfaces of the crystal blank 15. Further, the masks 103 have openings at the positions where the through-holes or recesses are to be formed in the upper and lower surfaces of the crystal blank 15, that is, at the positions where the wafer 101 is to be etched.

Accordingly, the masks 103 generally have the same shapes as the upper and lower surfaces of the crystal blank 15 (excluding the grooves 41). That is, the masks 103 have base part correspondence parts 105 (indicated by a two-dotted chain line in FIG. 4A) which are superimposed on the regions which will become the base parts 21, vibrating arm correspondence parts 107 which are superimposed on the regions which will become the vibrating arms 23, support arm correspondence parts (not shown) which are superimposed on the regions which will become the support arms 25, and projection part correspondence parts (not shown) which are superimposed on the regions which will become the projection parts 27.

From another viewpoint, the masks 103 have outer edge-use openings 109 (notation is shown in FIG. 4A) which are superimposed on the regions which will become voids in the periphery of the crystal blank 15 (regions to be etched). The outer edge-use openings 109 for example include lateral side openings 109a which are superimposed on the regions which will become voids on the lateral sides of the vibrating arms 23.

Further, the vibrating arm correspondence parts 107 have groove-use openings 111 which are superimposed on the regions which will become the grooves 41. From another viewpoint, the vibrating arm correspondence parts 107 have outer wall correspondence parts 113 which are superimposed on the regions which will become the outer walls 45, middle wall correspondence parts 115 which are superimposed on the regions which will become the middle walls 47, and transverse wall correspondence parts 117 (indicated by a two-dotted chain line in FIG. 4B) which are superimposed on the regions which will become the transverse walls 49.

As explained above, the masks 103 have schematically the same shapes as those of the upper and lower surfaces of the crystal blank 15. Therefore, for example, the already described explanation concerning the general shapes of the base parts 21 and vibrating arms 23 when viewed by a plan view generally applies to the shapes of the base part correspondence parts 105 and vibrating arm correspondence parts 107 etc., therefore is not repeated here.

Here, in the method of production of the crystal blank 15, one of the characteristic features resides in that the widths (D1-axis direction) of the middle wall correspondence parts 115 becoming relatively small relative to the widths of the outer wall correspondence parts 113 and the widths of the transverse wall correspondence parts 117.

Figure 6B:
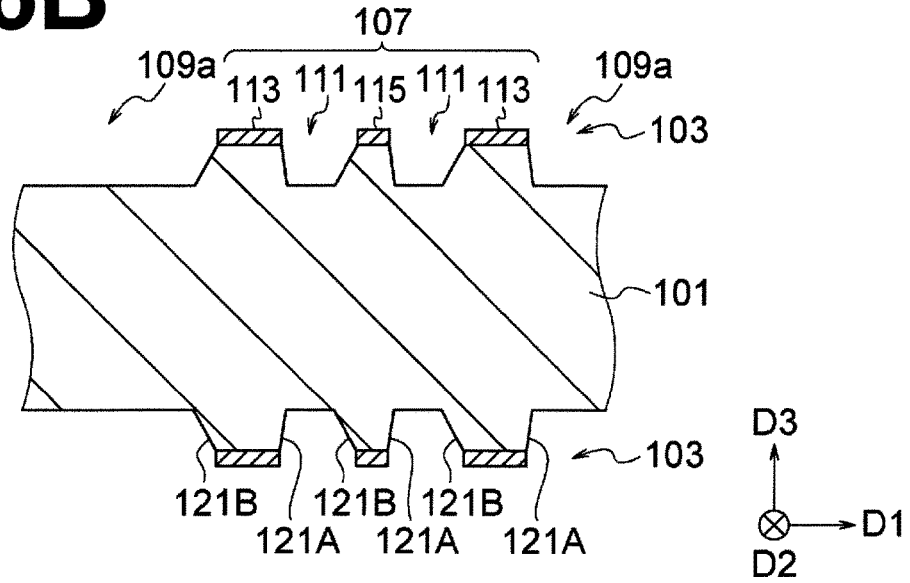

As shown in FIG. 6B, after forming the masks 103, the wafer 101 is etched (wet etched) through the masks 103. When the etching proceeds, due to the anisotropy of the crystal with respect to the etching, for example, first crystal planes 121A and second crystal planes 121B appear. Note that, for convenience, they are explained by using simple shapes. However, in actuality, three or more crystal planes facing suitable directions may appear.

As shown in this diagram, in the initial stage of etching, for example, when viewed from the cross-section, a recess is formed in a shape like a trapezoid having the crystal planes 121 as legs. Due to this, portions on the upper and lower surface sides of voids in the periphery of the crystal blank 15 and portions on the opening side of the grooves 41 are formed. That is, using the crystal planes 121 as wall surfaces, the portions on the apex part side of the outer walls 45, middle wall 47, transverse walls 49, and so on are formed. The etching rate differs according to the axial direction of the crystal axis. When comparing the etching rate of the outer edge-use openings 109 (lateral side openings 109a) and the etching rate of the groove-use openings 111, the etching rate of the outer edge-use openings 109 (lateral side opening 109a) is higher.

As shown in FIG. 7A, when the etching further proceeds, since the etching rate of the outer edge-use openings 109 (lateral side openings 109a) is higher than the etching rate of the groove-use openings 111, at the time when the through-holes are formed right under the outer edge-use openings 109, recesses are formed right under the groove-use openings 111. Due to this, the outer edges of the base parts 21, vibrating arms 23, support arms 25, and projection parts 27 and general shapes of the grooves 41 are formed.

As shown in FIG. 7B, when the etching further advances, the etching advances also on the periphery of the openings of the masks 103. For example, the crystal planes 121 which configure the wall surfaces of the outer walls 45 and middle walls 47 move to the inner side from the edge parts of the outer wall correspondence parts 113 and middle wall correspondence parts 115. Further, so-called under etching sometimes occurs. Further, the top surfaces of the portions for forming the outer walls 45 and middle walls 47 become gradually smaller in areas. Note that, etching resulting in the areas of the top surfaces becoming smaller sometimes occurs a little also in the process from FIG. 6A to FIG. 7A.

Here, the middle wall correspondence parts 115 are narrower in widths compared with the outer wall correspondence parts 113. Accordingly, when etching resulting in the areas of the top surfaces becoming smaller advances, right under the outer wall correspondence parts 113, in a state where the top surfaces contacting the masks 103 remain, the top surfaces which have been in contact with the masks 103 are eliminated directly under the middle wall correspondence parts 115. That is, the positions of the apex parts of the portions which become the middle walls 47 become lower with respect to the apex parts of the portions which become the outer walls 45. Further, when clearances are formed between the portions which become the middle walls 47 and the middle wall correspondence parts 115 in this way, the etching solution enter into these clearances, so etching lowering the portions which become the middle walls 47 easily advances.

As shown in FIG. 7C, when the etching further advances, a vibrating arm 23 having the outer walls 45 and the middle walls 47 which are lower than the outer walls 45 is formed.

Note that, it was stated that while the top surfaces of the middle walls 47 contacting the masks 103 are eliminated, the top surfaces of the outer walls 45 contacting the masks 103 remain. However, at the transverse walls 49 as well, since the widths of the transverse wall correspondence parts 117 are broader than the widths of the middle wall correspondence parts 115, the top surfaces contacting the masks 103 easily remain.

The smaller the diameters of the groove-use openings 111, the lower the liability of the grooves 41 becomes through-holes. From another viewpoint, the smaller the diameters of the groove-use openings 111, the longer the etching time can be made. Accordingly, in the upper surface or lower surface of one vibrating arm 23, by not forming one wide groove, but by forming two or more thin grooves 41, the etching time can be made longer while making the width of the overall grooves equal to the width of one wide groove (while maintaining the thickness t1 of the outer wall 45 thin). By maintaining the thin thickness t1 of the outer wall 45, for example, the CI can be maintained at a low level. By making the etching time long, for example, the etching is sufficiently carried out on the side surface etc. of the vibrating arm 23, and thus the residue can be reduced.

So far as the widths of the middle wall correspondence parts 115 are smaller relative to the widths of the outer wall correspondence parts 113, in the process of etching, there exists a time at which the top surfaces of the middle walls 47 contacting the masks 103 are eliminated, while the top surfaces of the outer walls 45 contacting with the masks 103 remain. Further, the larger the difference between the widths of the outer wall correspondence parts 113 and the widths of the middle wall correspondence parts 115, the longer that time. Accordingly, the dimensions of the masks 103 and the etching time for forming the middle walls 47 which are lower than the outer walls 45 can be easily found through experiments and so on and may be suitably adjusted.

An example of the dimensions of the masks 103 will be shown. The widths of the outer wall correspondence parts 113 are 7 µm to 9 µm. The widths of the middle wall correspondence parts 115 are 4 µm to 6 µm or ¼ to ¾ of the widths of the outer wall correspondence parts 113. The widths of the transverse wall correspondence parts 117 are 6 µm to 8 µm. The widths of the groove-use openings 111 are 8 µm to 11 µm. With such dimensions, for example, when using general liquid chemicals and equipment used for wet etching of crystal wafers, by etching for about 5 to 10 hours, the outer walls 45, the middle walls 47 lower than the outer walls 45, and the transverse walls 49 having heights higher than the middle walls 47, but not higher than the outer walls 45 are formed.

As described above, in the present embodiment, the crystal blank 15 includes the vibrating arms 23 which extend in the direction (D2-axis direction) perpendicular to the polarization direction (X-axis direction, D1-axis direction). Each vibrating arm 23 includes a long shaped predetermined surface (upper surface or lower surface) which is parallel to the D2-axis direction and follows the X-axis direction and is provided with two or more (two in the present embodiment) recesses 51 (grooves 41) in the width direction of the predetermined surface (D1-axis direction) and thus includes a pair of outer walls 45 which are positioned on the two sides of the two or more recesses 51 and one or more (one in the present embodiment) middle wall 47 which is positioned between the two or more recesses 51. In the middle wall 47, the apex part is located at a position lower than the apex part of each of the pair of outer walls 45, and the thickness is thinner than that of each of the pair of outer walls 45 at the same height.

Accordingly, for example, the CI can be lowered. Note that, it is confirmed by experiments by the inventors of the present application that the CI falls due to the configuration described above (by forming the middle wall 47 lower and thinner than the outer walls 45). As the reasons for the CI falling, the following two reasons can be mentioned.

First, when the middle wall 47 becomes low and thin, the portion which becomes the strut positioned at the center side of the vibrating arm 23 becomes smaller. As a result, the vibrating arm 23 becomes easier to vibrate. From another viewpoint, concerning the vibration of a vibrating arm 23, the ratio of contribution by the stress or deformation generated in the outer wall 45 becomes larger. On the other hand, in the outer wall 45, the first excitation electrode 17V and the second excitation electrode 17H are formed on the two wall surfaces thereof, and these excitation electrodes 17 face in the D1-axis direction. That is, in the outer wall 45, the ratio of contribution to the electric field exciting the vibrating arm 23 in the D1-axis direction is large, and the ratio of contribution to the extraction of electrical charges which are generated due to the vibration in the D1-axis direction of the vibrating arm 23 is large. For this reason, the excitation and extraction of electrical charges can be efficiently carried out, and the CI falls.

Second, when the middle wall 47 becomes low and thin, the opening side of the groove 41 becomes broader. As a result, when the conductive material is arranged on the upper and lower surfaces of the vibrating arm 23 by sputtering etc. in order to form the first excitation electrodes 17V, the conductive material becomes easier to enter the groove 41. That is, the first excitation electrode 17V will be formed up to the deep position of the groove 41. Consequently, also the facing area of the first excitation electrode 17V and the second excitation electrode 17H sandwiching the outer wall 45 therebetween becomes large. Accordingly, the vector of the electric field formed by these excitation electrodes 17 becomes large in the component parallel to the D1-axis, therefore the vibration of the vibrating arm 23 becomes larger. Further, the quantity of the electrical charges extracted from the outer wall 45 increases. For this reason, the CI falls.

Further, in the present embodiment, between the pair of outer walls 45, their apex parts are located at equal heights to each other, and the thicknesses are equal at the same height.

Accordingly, the rigidities, piezoelectric effects, and inverse piezoelectric effects of the pair of outer walls 45 in the D1-axis direction are apt to become equal. Consequently, the possibility of unintended bias of vibration or spurious emission is reduced, therefore the characteristics of the crystal unit 1 are improved.

Further, in the present embodiment, two or more sets each comprising two or more (two in the present embodiment) recesses 51 are provided in the direction (D2-axis direction) in which the vibrating arm 23 extends, therefore the vibrating arm 23 has one or more transverse walls 49 which are positioned between two or more sets each comprising two or more recesses 51 as described above. The apex parts of the transverse walls 49 are located at positions higher than the apex parts of the middle walls 47.

Here, for example, when focusing on the manufacturing process, since the middle wall correspondence part 115 is thin, when the apex part side of a portion which becomes the middle wall 47 is etched, the etching of the portion which becomes the groove 41 is liable to advance too much and the groove 41 is liable to become a through-hole. However, the transverse wall correspondence part 117 is broader than the middle wall correspondence part 115 and the apex part side of the portion which becomes the transverse wall 49 can remain more easily than the apex part side of the portion which becomes the middle wall 47, therefore the liability of the groove 41 becoming a through-hole is reduced. A transverse wall 49 is a wall crossing the direction of extension of the vibrating arm 23. Therefore, compared with the middle wall 47 extending in the direction of extension of the vibrating arm 23, the influence of the transverse wall 49 exerted upon the bending rigidity of the vibrating arm 23 is extremely low. Accordingly, the liability of rise of the CI due to the provision of the transverse wall 49 is low.

Further, in the present embodiment, the vibration element 3 has the crystal blank 15 as described above, a first excitation electrode 17V which is arranged on the upper surface or lower surface of the vibrating arm 23 over two or more (two in the present embodiment) recesses 51 (grooves 41), and second excitation electrodes 17H which are arranged on each of the pair of side surfaces of the vibrating arm 23 which are positioned on the two sides of the width direction (D1-axis direction) of the upper surface or lower surface with respect to the surface and intersect with the surface. Accordingly, the effect as explained above that the first excitation electrode 17V is arranged down to the bottom of the groove 41 and the CI falls is exerted.

Further, in the present embodiment, the piezoelectric device (crystal device, crystal unit 1) has the mounting base (element mounting member 5) on which the vibration element 3 as described above is mounted, therefore the effect of lowering the CI is exerted.

Further, in the present embodiment, the method of production of the crystal blank 15 includes the mask forming step (FIG. 6A) of forming a mask 103 on the major surface (upper surface and/or lower surface) of the piezoelectric wafer (wafer 101 made of crystal) along the polarization direction thereof (X-axis direction, D1-axis direction) and the etching step (FIG. 6B to FIG. 7C) of etching the wafer 101 through the mask 103. The mask 103 has a long shaped vibrating arm correspondence part 107. The vibrating arm correspondence part 107 is provided with two or more (two in the present embodiment) openings (groove-use openings 111) in the width direction of the vibrating arm correspondence part 107 (D1-axis direction) thereby having the pair of outer wall correspondence parts 113 which are positioned on the two sides of the two or more groove-use openings 111 and one or more (one in the present embodiment) middle wall correspondence parts 115 which are positioned between the two or more groove-use openings 111. The middle wall correspondence part 115 is thinner than the pair of outer wall correspondence parts 113. In the etching process, the etching of the outside of the vibrating arm correspondence part 107 (directly under the lateral side opening 109a) and the etching in the two or more groove-use openings 111 are started together (FIG. 6B). The etching is continued until the region in the major surface of the wafer 111 contacting the middle wall correspondence part 115 is etched from the edge part on one side up to the edge part on the other side in the middle wall correspondence part 115 (FIG. 7C).

Accordingly, for example, the crystal blank 15 capable of lowering the CI by the middle wall 47 becoming lower and thinner than the outer walls 45 can be formed by one etching operation due to the etching anisotropy in the crystal orientation of the crystal. As a result, the manufacturing process is simplified, and a reduction of cost can be expected.

Further, for example, the time for etching through the groove-use openings 111 and the time for etching through the outer edge-use openings 109 become the same. Therefore, between the pair of outer walls 45, the etching times become the same between the wall surfaces facing the same side of the D1-axis direction. As a result, between the pair of outer walls 45, the shapes (including dimensions) easily become the same. Further, the above-explained preferred effects obtained due to the shapes of the pair of outer walls 45 being the same as each other are exerted.

Note that, in the above embodiment, the crystal blank 15 is one example of the piezoelectric blank, the crystal vibration element 3 is one example of the piezoelectric vibration element, the crystal unit 1 is one example of the piezoelectric vibration device, the D1-axis direction is one example of the polarization direction, the vibrating arms 23 are one example of the arm parts, each of the upper surface and lower surface of the vibrating arm 23 is one example of the predetermined surface of the arm parts, the first excitation electrode 17V is one example of the first electrode, the second excitation electrode 17H is one example of the second electrode, the element mounting member 5 is one example of the mounting base, the wafer 101 is one example of the piezoelectric wafer, and the vibrating arm correspondence part 107 is one example of the arm correspondence part.

The present invention is not limited to the embodiment or modifications explained above and may be executed in various ways.

The piezoelectric blank, piezoelectric vibration element, and piezoelectric vibration device are not limited to a crystal blank, crystal vibration element, and crystal vibration device. For example, the piezoelectric blank need not be a crystal, but may be one made a monocrystalline or polycrystalline ceramic.

Further, the piezoelectric blank, piezoelectric vibration element, and piezoelectric vibration device are not limited to ones for generating oscillation signals. For example, the piezoelectric vibration device may be a piezoelectric vibration type gyro sensor as well. Further, the piezoelectric device which generates the oscillation signal is not limited to a crystal unit (piezoelectric unit). For example, the piezoelectric device may be an oscillator which is provided with a portion acting as the piezoelectric unit, and an oscillation circuit as well. Further, the piezoelectric unit may be provided with a thermistor or other electronic parts other than the vibration element.

The arm part to which the invention of the present application is applied is not limited to a vibrating arm which is excited by excitation electrodes. For example, in the case where the piezoelectric vibration device is a gyro sensor having the vibrating arms which are excited by excitation electrodes and a detection arm which vibrates following the vibration of the vibrating arms and is utilized for extracting electrical charges (signals), the invention of the present application may be applied to the detection arm as well. From another viewpoint, the first electrode and second electrode provided in the arm part are not limited to excitation electrodes, but may be detection electrodes which are provided at the detection arm in order to extract the electrical charges.

The piezoelectric blank is not limited to a shape that has a base part and a pair of arms extending from the base part in parallel to each other (for example a tuning fork type). For example, the piezoelectric blank may have only one arm, may have three or more arms which extend parallel to each other, or may have a plurality of arms which extend in reverse directions from each other.

Further, in the piezoelectric blank, the support arm and projection part etc. are not indispensable factors. For example, the base part may be directly fixed to the element mounting member or the like. The mounting structure of the piezoelectric vibration element and the structure of the package of the piezoelectric device (element mounting member and lid member) and so on may be known various structures.

As apparent from the above-described fact that the piezoelectric substance may be polycrystalline, the polarization direction is not limited to the direction of the electrical axis (X-axis) and for example may be the direction which is suitably polarized in a polycrystalline substance.

The arm part may extend in the direction crossing the polarization direction and does not always have to be perpendicular to the polarization direction either. It is sufficient so far as the arm part can vibrate so as to bend in the width direction by application of voltage to the width direction of the arm part. For example, in the embodiment, the D1-axis perpendicular to the arm part may have a slight inclination (for example less than 15°) around the Y-axis or Z-axis relative to the X-axis (electrical axis) as well. Further, for example, in a gyro sensor, there is known a crystal blank having three arm parts which are provided corresponding to three electrical axes extending in directions different from each other at an interval of 120° around the optical axis. The arm parts may intersect with respect to any electrical axis (polarization direction) like this crystal.

As understood from the above description, the predetermined surface (upper surface or lower surface) on which the outer walls and middle wall are formed may roughly follow the polarization direction (electrical axis) and need not always be parallel. For example, in the embodiment, the D3-axis perpendicular to the predetermined surface may have a slight inclination (for example less than 15°) around the Y-axis relative to the x-axis (electrical axis).

Further, as apparent from the fact that the piezoelectric substance may be polycrystalline, the relationships between the directions other than polarization direction (for example mechanical axis and optical axis of the single crystal) and the orientation of the arm parts may be suitably set. For example, in the embodiment, the case where the mechanical axis and the arm parts schematically follow (inclination not more than 5°) was exemplified. However, the two may cross each other at an angle larger than that as well.

In each vibrating arm, the grooves (middle wall and outer walls) need not be formed in both of the upper surface and lower surface and may be provided in only one surface among them. Further, in the upper surface and lower surface of one vibrating arm, the number of grooves (recesses) is not limited to two and may be three or more. The wafer may also be etched not from the two surfaces, but from one surface.

A piezoelectric blank in which the middle wall is lower and thinner than the outer walls makes it possible to form both of the outer edges and grooves of the piezoelectric blank by one etching operation and consequently makes it possible to make the shapes of the pair of outer walls the same. However, the piezoelectric blank may be formed by two etching operations as disclosed in Patent Literature 1 as well.

REFERENCE SIGNS LIST

1 . . . crystal unit (piezoelectric device), 3 . . . crystal vibration element (piezoelectric vibration element), 15 . . . crystal blank (piezoelectric blank), 21 . . . base part, 23 . . . vibrating arm, 41 . . . groove (recess), 45 . . . outer wall, 47 . . . middle wall, and 51 . . . recess.

The invention claimed is:

1. A piezoelectric vibration element comprising:
a piezoelectric blank comprising:
   an arm part which extends in a direction intersecting the polarization direction, wherein
   the arm part comprises a predetermined surface which is parallel to the direction of extension of the arm part and runs along the polarization direction and is provided with two or more recesses in the width direction of the predetermined surface, thereby comprising a pair of outer walls which are positioned on the two sides of the two or more recesses and one or more middle walls positioned between the two or more recesses, and
   the middle wall comprises an apex part located at a position lower than the apex part of each of the pair of outer walls and is thinner than each of the pair of outer walls at the same height;
a first electrode which is arranged over the two or more recesses on the predetermined surface, and
a pair of second electrodes which are arranged on a pair of side surfaces of the arm part which are positioned on the two sides of the width direction relative to the predetermined surface and intersect with the predetermined surface.

2. The piezoelectric vibration element according to claim 1, wherein the pair of outer walls comprise apex parts located at heights equal to each other and have equal thicknesses at the same heights.

3. The piezoelectric vibration element according to claim 1, wherein, the arm part is provided with two or more sets of recesses each comprising two or more recesses, in its extension direction, thereby comprising one or more transverse walls positioned among the two or more sets of recesses, and
the apex part of transverse wall is located at a position higher than the apex part of the middle wall.

4. A piezoelectric vibration device comprising:
a piezoelectric vibration element according to claim 1 and
a mounting base on which the piezoelectric vibration element is mounted.

* * * * *